(12) United States Patent
Hilgers

(10) Patent No.: US 7,944,332 B2
(45) Date of Patent: May 17, 2011

(54) SELF-LOCKING MICRO ELECTRO MECHANICAL DEVICE

(75) Inventor: Achim Hilgers, Alsdorf (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 12/376,311

(22) PCT Filed: Jul. 24, 2007

(86) PCT No.: PCT/IB2007/052939
§ 371 (c)(1),
(2), (4) Date: Jun. 29, 2010

(87) PCT Pub. No.: WO2008/017978
PCT Pub. Date: Feb. 14, 2008

(65) Prior Publication Data
US 2010/0263997 A1    Oct. 21, 2010

(30) Foreign Application Priority Data
Aug. 9, 2006  (EP) .................................. 06118658

(51) Int. Cl.
*H01H 57/00*    (2006.01)
*H01H 61/02*    (2006.01)

(52) U.S. Cl. ......................................... 335/78; 200/181

(58) Field of Classification Search .................... 335/78; 200/181; 310/309
See application file for complete search history.

(56) References Cited

U.S. PATENT DOCUMENTS

| 7,283,112 | B2 * | 10/2007 | Starkweather et al. | 345/84 |
| 7,302,157 | B2 * | 11/2007 | Chui | 385/147 |
| 7,446,927 | B2 * | 11/2008 | Chui | 359/290 |
| 7,782,170 | B2 * | 8/2010 | Robert | 337/85 |
| 2002/0097136 | A1 | 7/2002 | Coleman, Jr. et al. | |
| 2002/0196110 | A1 | 12/2002 | Vaitkus et al. | |
| 2003/0117257 | A1 | 6/2003 | Cunningham | |
| 2003/0155932 | A1 | 8/2003 | Staple et al. | |
| 2005/0088404 | A1 * | 4/2005 | Heines et al. | 345/108 |
| 2005/0244099 | A1 | 11/2005 | Pasch et al. | |
| 2007/0001542 | A1 * | 1/2007 | Neidrich | 310/309 |

* cited by examiner

*Primary Examiner* — Ramon M Barrera
(74) *Attorney, Agent, or Firm* — Larry Liberchuk

(57) ABSTRACT

The proposed invention application describes a novel configuration of an extremely small self-locking switching component, based on micro-electromechanical systems (MEMS) technology. Conventional MEMS switches need a continual control signal in order to obtain the wanted active (switching) state. The proposed invention needs only a short control signal (non-locking key) such as e.g. a pulse in order to switch the component on and/or off. RF-noise (ripples) on the de-control signal or bouncing effects can be neglected according to the proposed extension of the MEMS devices. This contributes to an easier and especially more robust design of electronic circuitries and allows for enhanced functionalities.

10 Claims, 4 Drawing Sheets

SELF-LOCKING MICRO ELECTRO MECHANICAL DEVICE

FIELD OF THE INVENTION

The current invention is related to self-locking micro electro mechanical devices and methods of manufacturing and operating such devices.

BACKGROUND OF THE INVENTION

In US 2005/0244099 A1 a cantilevered micro-electromechanical switch array is described comprising flexible microelectromechanical switches with latching mechanism. The switches comprise a base layer having a conductive trace and at least one contact and a flexible cantilevered platform having a conductive trace and at least one contact aligned with said base layer conductive trace and contact; said base layer and said cantilevered platform maintained in a spaced apart by a spacer layer if no bias is applied to said conductive traces and in mechanical engagement at one portion of said cantilevered platform when a bias is applied to said conductive traces; and a latching or self-locking mechanism for maintaining said cantilevered platform in mechanical engagement with said base layer after said bias is removed. The latching mechanism is characterized by a latch trace with a latch trace contact and a latch power trace with a latch power contact on the base layer and a bridge contact on the flexible cantilevered platform. Latch contact trace transfers power to latch trace so that the flexible cantilevered platform is maintained in the deflected position as long as the appropriate bias is applied to latch power trace even if the bias is removed from the conductive traces. It is a drawback of this switch with latching mechanism that the latch trace has to comprise sufficient area of conductive material to maintain the switch in the closed state increasing the size of the switch.

SUMMARY OF THE INVENTION

It's an objective of the current invention to provide a micro electro mechanical device with an improved self-locking mechanism. The objective is achieved by means of a MEMS device comprising a moveable structure, a base structure, at least one actuation structure moving the moveable structure, a self locking device, an on-key, an off-key, an electrical power supply which electrical power supply can be electrically connected with the actuation structure and the self-locking device via a first electrically conductive path passing the on-key, and the self locking device can provide a switchable second electrically conductive path between the electrical power supply and the actuation structure via the off-key. The moveable structure does essentially have two stable states. The first state where no electrical power is provided to the actuation structure and the second state where electrical power is provided to the actuation structure. The on-key is a switching device as e.g. a transistor, being in an open state as long as no control signal is provided to the on-key and being in a closed state as long as a control signal is provided to the on-key. The off-key is a switching device as e.g. a transistors, being in a closed state as long as no control signal is provided to the off-key and being in an open state as long as a control signal is provided to the off-key. The on-key and the off-key can be electrically connected with the same terminal of the electrical power supply. If a first control signal is provided to the on-key electrical power is provided to the actuation structure via a first path and the moveable structure moves from the first state to the second state. The self-locking device e.g. a logic circuit or a pair of electrodes as discussed below characterized by an open non-conductive state and a closed conductive state changes from the open state to the close state either directly initiated by means of the first control signal to the logic circuitry or indirectly initiated by the movement of the moveable structure from the first state to the second state. In the closed state the self-locking device enables a separate second path for providing electrical power to the actuation structure. The on-key is opened again after the first control signal is interrupted. The moveable structure maintains in the second state since electrical power is provided to the actuation structure via the off-key and the self-locking device. The moveable structure moves back in the first state driven by the elastic forces of the moveable structure or the suspension where the moveable structure is attached to as soon as the off-key is opened by means of a second control signal and no electrical power is provided to the actuation structure. Additionally the self-locking device changes from the close state to the open state either directly initiated by means of the second control signal delivere to the logic circuit or indirectly initiated by the movement of the moveable structure from the second state to the first state. Consequently no electrical power can be transferred via the second path even if the second control signal is interrupted and the off-key is closed again. In contrast to prior art the actuation to maintain the moveable structure in a specific position is not provided by a separate set of electrodes. The current invention enables a simpler solution to lock the MEMS device enabling miniaturization and cost savings. Applications are tunable MEMS resonators or MEMS switches. In a MEMS resonator the current invention can be used to tune the resonance frequency of the MEMS resonator structure if one or more actuation devices are arranged e.g. in the suspension(s) of the MEMS resonator structure. The actuation devices are used to change the mechanical parameters of the suspension(s) or the MEMS resonator structure. In MEMS switch the actuation device can be used to transfer e.g. RF-signals if the actuation device comprises e.g. two electrodes exercising an electrostatic actuation if electrical power is applied resulting in a variation of the capacitance between the two electrodes.

In a further embodiment of the current invention the self-locking device comprises a first self-locking electrode attached to the moveable structure and a second self-locking electrode attached to the base structure. The self-locking electrodes touch each other if the moveable structure is in the second state. The physical contact between the self-locking electrodes closes the second conductive path between the electrical power supply and the actuation structure via the off-key. Only an electrical contact has to be established via the self-locking electrodes enabling small electrode areas since galvanic contacts are essentially point contacts determined by the surface roughness of the (self-locking) electrodes and the force applied to the (self-locking) electrodes. Further the actuation during the change from the first state to the second state of the moveable structure and in the second state is provide by means of the actuation structure being powered by the electrical power supply Since the same actuation structure is used to move and hold the moveable structure the force distribution along the moveable structure stays the same whereas in prior art the force distribution is different during movement and the actuated state since different pairs of electrodes are used causing higher complexity of switch design. The current invention can further be used in MEMS switches where the self-locking electrodes are additionally used to provide a galvanic contact in order to transfer electrical signals. Using the self-locking electrodes as well as electrical contacts to provide electrical power to the actuation structure and functional electrodes to transfer e.g. RF signals might cause additional measures as coils to block the RF signals in the power supply paths and capacitors to block the DC bias in the signal paths.

In a further embodiment of the current invention the MEMS device further comprising at least a first signal electrode attached to the moveable structure and at least a second signal electrode attached to the base structure. The additional signal electrodes enable the separation of actuation and signal transfer limiting or preventing unwanted interference. In addition a dielectric material enabling a capacitive MEMS switch suitable for RF applications can cover at least one of the signal electrodes. A not finalized list of well-known options for a person experienced in the art to configure such MEMS devices is given by:

- One signal electrode attached to the moveable structure and one signal electrode attached to the base structure either with or without dielectric layer attached to one or both electrodes. The signal electrode attached to the moveable structure transfers the signal via the moveable structure to further devices.
- One signal electrode attached to the moveable structure and two signal electrodes attached to the base structure. The signal electrode attached to the moveable structure provides a bridge (capacitive of galvanic) for the signal between the two signal electrodes attached to the base structure.
- Two signal electrodes attached to the moveable structure and one signal electrode attached to the base structure. The signal electrode attached to the base structure provides a bridge (capacitive of galvanic) for the signal between the two signal electrodes attached to the moveable structure.

In another embodiment of the current invention the on-key is an n-channel field effect transistor (e.g. a MOSFET of enhancement type) and the off-key is a n-channel field effect transistor (e.g. a J-FET of depletion type). Without any control signals the 'on'-MOSFET stays in a non-conducting mode and the 'off'-J-FET in a conducting mode. The gates of the MOSFET and the J-FET may be connected via a resistor to ground. If a positive first control signal is fed to the gate of the n-channel MOSFET the drain source channel gets conductive activating the actuation structure. If a negative second control signal is fed to the gate of the n-channel J-FET the drain source channel is blocked deactivating the actuation structure.

In a further embodiment of the current invention the actuation structure moves the moveable structure by means of thermal deformation. The actuation structure comprises a resistive heating element attached to the moveable structure and a thermal deformable structure as e.g. a stack of two layers with different thermal expansion coefficient (as e.g. a bimetal) being arranged on top or below the resistive heating element. As soon as electrical power is delivered to the resistive heating element via the on-key, the resistive heating element heats up the stack of the two layers causing a bending of the stacked layers moving the moveable structure from the first state to the second state. The contact between the self-locking electrodes is closed guaranteeing the power supply of the resistive heating element. Activating the off-key the power supply of the resistive heating element is switched off and the stacked layer and the moveable structure go back to the first position. The activation periods of the on-key and the off-key have to be adapted to the inertia of the thermal deformation.

In a further embodiment of the current invention the actuation structure moves the moveable structure by electromagnetic actuation. The actuation structure can comprise a first coil attached to the moveable structure and a second coil attached to the base structure. Providing electrical power to the first coil and to the second coil causes a electromagnetic attraction moving the moveable structure from the first state to the second state. In a variation of the actuation structure the second coil can be replaced by a permanent magnet. Further ferromagnetic materials can be added in order to improve the electromagnetic actuation structure.

In a further embodiment of the current invention the actuation structure moves the moveable structure by means of piezoelectric actuation. In a first embodiment of a piezoelectric driven actuation structure, the actuation structure comprises a first electrode layer, a second electrode layer and a piezoelectric layer (e.g. made of Lead Zirconate Titanate PZT). The piezoelectric layer is sandwiched between the first and the second electrode layer and optionally one or more structural layers can be added. Providing electrical power to the first and the second electrode layer causes a deformation of the piezoelectric layer determined by the electric field between the first and the second electrode layer. The deformation of the piezoelectric layer essentially perpendicular to the electric field can be used to move the moveable structure (so called $d_{31}$-mode, whit $d_{31}$ being one of the piezocoefficients). In a second embodiment of a piezoelectric driven actuation structure, the actuation structure comprises one structured electrode layer comprising at least two electrodes and a piezoelectric layer (optionally structural layers can be added). The two electrodes are attached to one surface of the piezoelectric layer. Providing electrical power to the two electrodes causes a deformation of the piezoelectric layer determined by the electric field between the two electrodes. The deformation of the piezoelectric layer essentially parallel to the electric field (due to the in general high permittivity of the piezoelectric layer) can be used to move the moveable structure (so called $d_{33}$-mode, whit $d_{31}$ being one of the piezo-coefficients). Further embodiments with piezoelectric bulk actuators are also possible. The piezoelectric actuator structure essentially is a capacitor. In order to move the moveable structure back to the first state if the off-key is activated the capacitor has to be discharged. The capacitor can either be characterized by a specific leakage current, a resistor connecting the two electrodes or the two electrode layers or a switch short circuiting the capacitor if the off-key is activated. Depending on the design and the size of the MEMS device the capacitance of the actuation structure can be rather high (e.g. between 10 nF and 100 nF or even higher). The leakage current of the capacitor has to be rather high or the resistor connecting the two electrodes or the two electrode layers has to be rather low in order to discharge the capacitor in a reasonable period of time. In this case the leakage current and the resistor cause rather high losses as long as the moveable structure is in the second state. A further switch similar to the on-key connecting the electrodes or electrode layers of the capacitor can be used in order to reduce the losses. This switch is controlled by the second control signal and short circuits the capacitor as soon as the off-key is activated. An example of such a switch is e.g. an n-channel MOSFET (of enhancement type) with the drain and source connected between the electrodes or electrodes layers of the capacitor. The MOSFET is in its non-conducting mode until a positive control signal is fed to the gate, which causes the MOSFET to switch into its conducting mode. The gate of the MOSFET may be connected via a resistor to ground.

In a further embodiment of the current invention the actuation structure moves the moveable structure by means of electrostatic actuation. The actuation structure comprises at least one first actuation electrode attached to the moveable structure and at least one second actuation electrode attached to the base structure. An isolating layer can cover one or both electrodes in order to prevent short circuits. Electrical power provided to the first and the second actuation electrode results in an electrostatic attraction of the first actuation electrode attached to the moveable structure causing the movement of the moveable structure from the first state to the second state. Comparable to the piezoelectric actuation structure described above the electrostatic actuation structure is a capacitor formed by the first and the second actuation electrode and the capacitor has to be discharged if the off-key is activated. The measures that can be used to enable a discharge of the capacitor are the same as described in connection with the piezoelectric actuation structure.

Further the embodiments of the current invention can e.g. be combined with multivibrator circuitries, which can be used to activate the electronic on/off keys. Depending on the chosen activating circuitry different functions can be realized:

a) Signal generation by means of an e.g. astable multivibrator, where the on- and off state can be adjusted according to an adequate selection of the values of additional capacitors and resistors.

b) Timing function by means of an e.g. monostable multivibrator, where the on state (or off state) can be chosen according to an adequate selection of the values of additional capacitor(s) and resistor(s).

c) Activating/inactivating function by means of an e.g. bistable multivibrator, where the signal of the input ports defines the status of the relating output terminals.

In addition other electronic circuitries can be used. Suitable also could be a Schmitt trigger, which allows for detecting signal (voltage) thresholds. It also has to be mentioned, that digital integrated solutions with the same functionality can be used.

It's further an objective of the current invention to provide a method of driving a MEMS device comprising a moveable structure, a base structure, at least one actuation structure moving the moveable structure, a self-locking device, an on-key, an off-key and an electrical power supply comprising the steps of:

providing a first control signal of a time period t1 to the on-key;

providing electrical energy to the actuation structure via a first electrically conductive path passing the on-key during the time period t1;

moving the moveable structure by means of the actuation structure during the time period t1 from a first state to a second state;

locking the moveable structure in the second state by means of the self-locking device providing a second conductive path between the electrical power supply and the actuation structure via the off-key during a time period t2 and releasing the moveable structure from the second state to the first state by applying a second control signal of a time period t3 to the off-key opening the self-locking device. The time period t1 has to last until the moveable structure is locked. The time period t2 starts when the moveable structure is locked and stops if the moveable structure is released. The end of the time t2 is reached during the time period t3 when the second control signal is applied to the off-key. The time period t3 has to be adapted to the inertia of the moveable structure and the actuation structure. In order to determine the time periods t1 and t3 some worst cast estimations have to be done possibly causing unnecessary long time periods for the first and the second control signal and consequently for switching. This can be prevented by adapting the time periods by detecting if the second state of the moveable structure is reached and the moveable structure is locked and providing a feed-back signal stopping the first control signal. In addition the release of the moveable structure can be detected and a further feed-back signal is provided to stop the second control signal. If the self-locking device comprises two self-locking electrodes the resistance between the self-locking electrodes can be measured in order to define a threshold value to trigger the feed back signals.

Additional features will be described below which can be combined together and combined with any of the aspects. Other advantages will be apparent to those skilled in the art, especially over other prior art. Numerous variations and modifications can be made without departing from the claims of the present invention. Therefore, it should be clearly understood that the form of the present invention is illustrative only and is not intended to limit the scope of the present invention.

BRIEF DESCRIPTION OF THE DRAWINGS

The present invention will now be explained in greater detail with reference to the figures, in which the same reference signs indicate similar parts, and in which:

FIG. 1 shows a principal sketch of MEMS switch essentially formed by a single clamped beam, whereby the beam comprises a piezoelectric material as Lead Zirconate Titanate (PZT). A moveable structure 30 formed by a beam having a first side and a second side is clamped at one side by means of a support structure 20. The support structure 20 is attached to the base structure 10. The moveable structure 30 extends essentially parallel above the base structure 10 whereby the first side of the moveable structure 30 faces the base structure 10. A first actuation electrode 120 is attached to the first side of the moveable structure and a second actuation electrode 110 is attached to the second side of the moveable structure 30. A part of the moveable structure 30 comprising PZT is sandwiched between the first actuation electrode 120 and the second actuation electrode 110 forming the actuation structure 100. Further a first self-locking electrode 220 and a first signal electrode 520 are attached to the first side of the moveable structure. The first self-locking electrode faces a second self-locking electrode 210 attached to the base structure 10. The first signal electrode 520 faces a second signal electrode 510 attached to the base structure 10. The first port of an electrical power supply 400 is connected to ground and the second port of the electrical power supply 400 providing a positive voltage with respect to ground is connected to the first port of an on-key 310 and to the first port of an off-key 320 switched in parallel to the on-key 320. The second port of the on-key 310 is electrically connected to the second actuation electrode and to the first self-locking electrode 220. The second port of the off-key 320 is electrically connected to the second self-locking electrode 210. The first actuation electrode 120 is electrically connected to ground. In the starting position the self-locking electrodes are separated from each other. If a first control signal is provided to the on-key 310 the first port and the second port of the on-key 310 are electrically connected for the duration of the first control signal. A voltage is applied between the first actuation electrode 120 and the second actuation electrode 110 resulting in a deformation of the piezoelectric material sandwiched between the electrodes and the moveable structure 30 bends towards the base structure 10. During the bending of the moveable structure the first self-locking electrode 220 touches the second self-locking electrode 210 and an electrically conductive connection between both self-locking electrodes is established. The off-key 320 provides an electrically conductive connection between its first and second port as long as no second control signal is provided. The electrical contact between the self-locking electrodes provides a second electrically conductive path between the second actuation electrode 110 and the second port of the electrical power supply 400. After the first control signal is interrupted opening the electrically conductive path between the first port and the second port of the on-key 310 the voltage between the first and second actuation electrode is applied via the off-key and the short circuited self-locking electrodes. Further the movement of the moveable structure 30 brings the first signal electrode 510 and the second signal electrode 520 in electrical contact that a RF-signal can be transferred via this contact. A second control signal applied to the off-key 320 opens the electrical connection between the second actuation electrode 110 and the electrical power supply 400. The electrical energy stored between the first actuation electrode 120 and the second actuation electrode 110 discharges via a resistor 600 connecting both actuation electrode. The moveable structure 30 moves back to the starting position and the self-locking electrodes are separated.

FIG. 2 shows a principal sketch of a further embodiment of the current invention. The structure of the MEMS switch and the electrical connections is in substance identical with the embodiment described in connection with FIG. 1. The on-key 310 is specified by means of an n-channel field effect transistor (MOSFET of enhancement type). The off-key 320 is specified by means of an n-channel field effect transistor (J-FET of depletion type). Without any control signals the MOSFET (on-key 310) stays in a non-conducting mode and the J-FET (off-key 320) in a conducting mode. The gates of the MOSFET and the J-FET may be connected via a resistor to ground. If a positive first control signal is fed to the gate of the n-channel MOSFET the drain source channel gets conductive activating the actuation structure. If a negative second control signal is fed to the gate of the n-channel J-FET the drain source channel is blocked deactivating the actuation structure. Different as depicted in FIG. 1 the second signal electrode 510 is covered with an electrically isolating dielectric layer 530. The dielectric layer 530 (e.g. $SiO_2$, $Si_3N_4$) prevents a short circuit of the signal electrodes. In the closed state of the switch the RF-signal is capacitively coupled from one signal electrode to the other. In the starting position an additional gap separates the signal electrodes nearly suppressing the coupling of the RF-signal. Using transistors enables to manufacture an integrated MEMS switch by means of well-known MEMS technologies as e.g. sacrificial layer etching and thin film deposition techniques as e.g. sol gel to deposit the piezoelectric material. Well-known semiconductor technologies can be used to integrate the transistor e.g. in the base structure e.g. comprising silicon.

FIG. 3 shows a principal sketch of a further embodiment of the current invention. The structure of the MEMS switch and the electrical connections is in substance identical with the embodiment described in connection with FIG. 1. The actuation structure 100 comprises a first capacitive actuation electrode 115 attached to the moveable structure 30 and a second capacitive actuation electrode 125 attached to the base structure 10. The second capacitive actuation electrode is covered by an electrically isolating dielectric layer 140 preventing short circuits. A voltage can be applied between the actuation electrodes in the same way as described in connection with the embodiment depicted in FIG. 1. The moveable structure 30 has not to comprise piezoelectric material. Additionally the resistor 600 is replaced by means of an additional discharge-key 700. The discharge-key 700 provides an electrical connection between the first capacitive actuation electrode 115 and the second capacitive actuation electrode 125 triggered by the second control signal opening the off-key 320. The capacitor formed by the actuation electrodes discharges and the movable structure moves back in the first position.

FIG. 4 shows a principal sketch of a further embodiment of the current invention. The structure of the MEMS switch and the electrical connections is in substance identical with the embodiment described in connection with FIG. 1. The essential difference is the actuation structure formed by means of a resistive heating element causing a thermal deformation of the moveable structure 30 if an electrical current is provided by means of the electrical power supply 400 via the on-key or via the off-key. In contrast to the embodiment shown in FIG. 1 no resistor 600 is needed since the resistive heating element stops heating as soon as no electrical current is provided.

Figure 1:
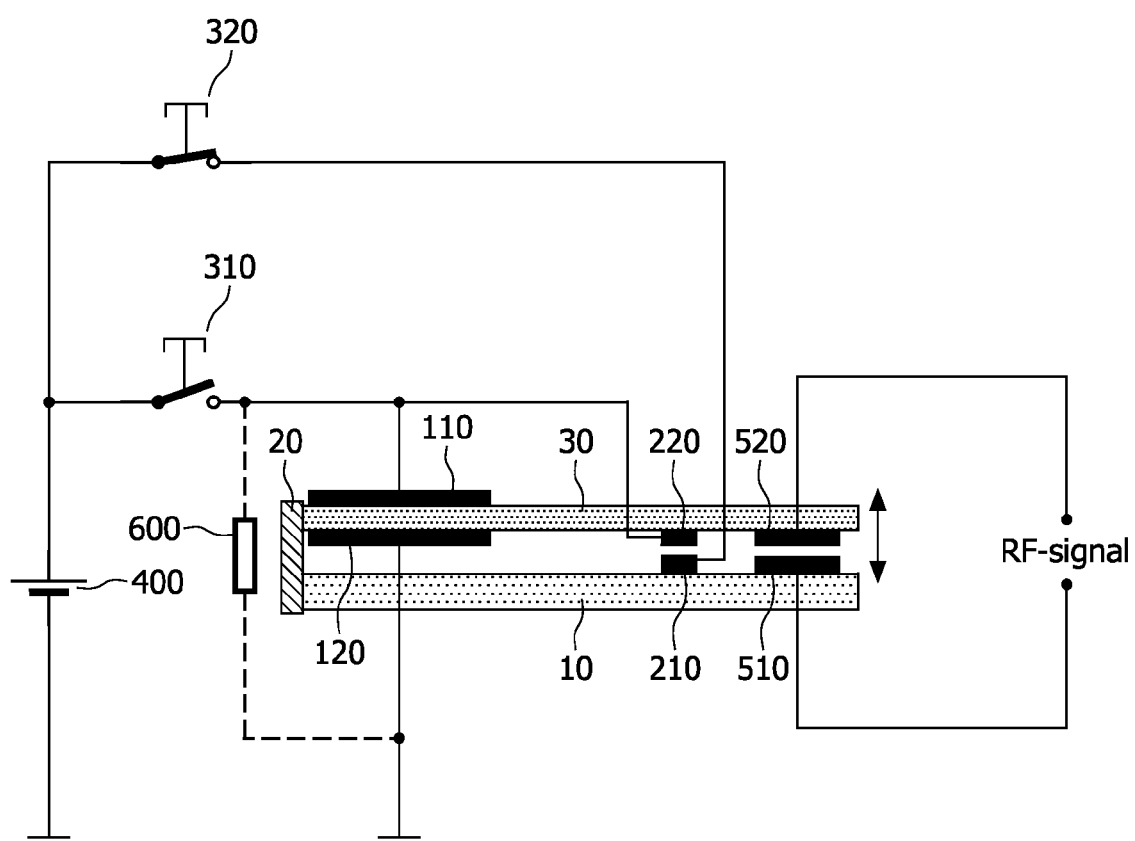
FIG. 1 shows a principal sketch of a first embodiment of the current invention with a piezoelectric actuation structure.
Figure 2:
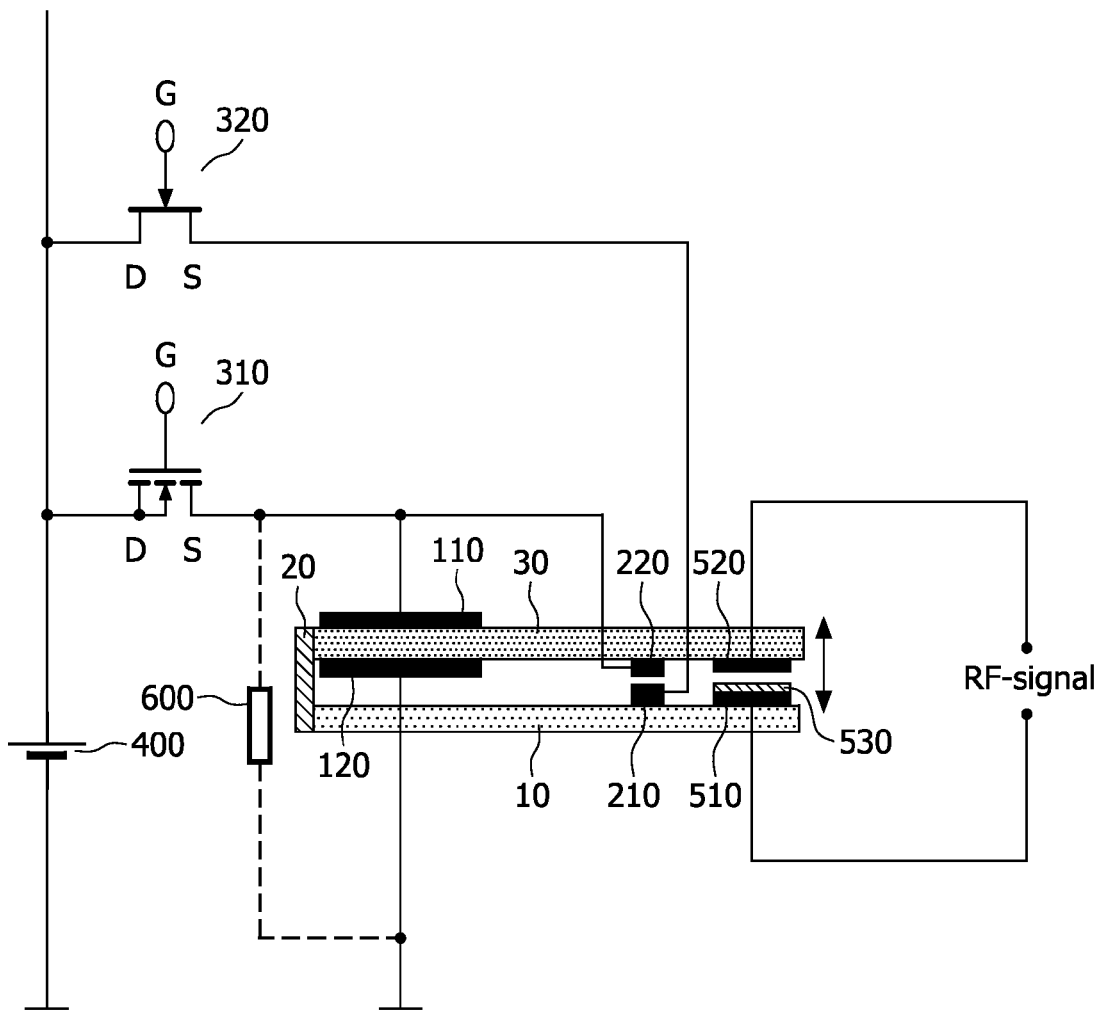
FIG. 2 shows a principal sketch of a second embodiment of the current invention with a piezoelectric actuation structure.
Figure 3:
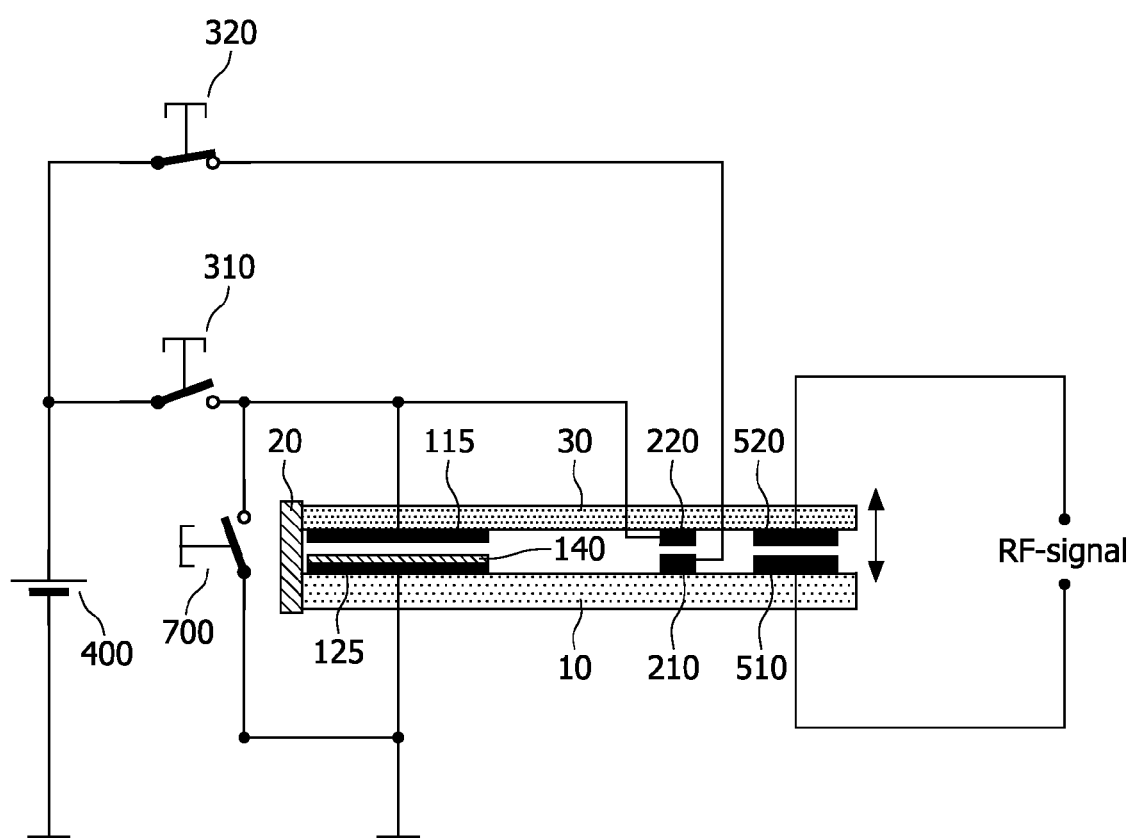
FIG. 3 shows a principal sketch of a third embodiment of the current invention with an electrostatic actuation structure.
Figure 4:
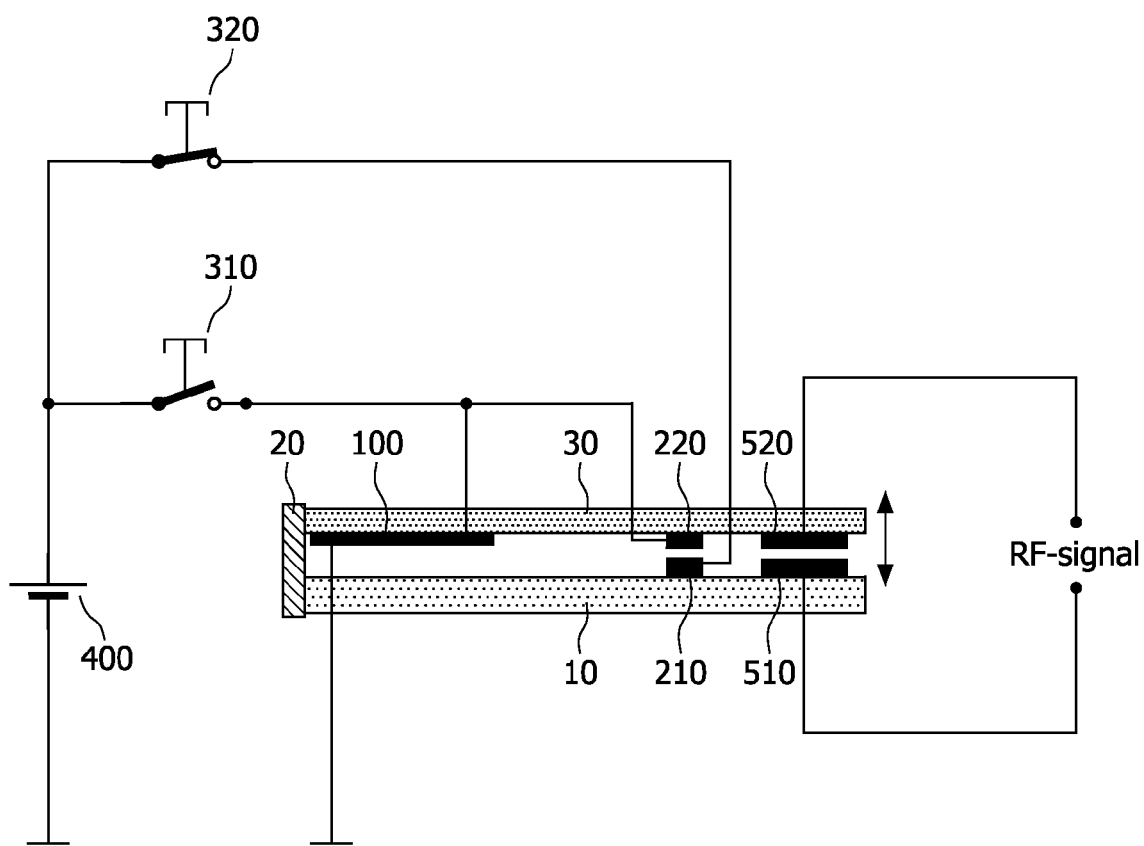
FIG. 4 shows a principal sketch of a forth embodiment of the current invention with a thermally activated actuation structure.

The current invention as discussed in combination with FIG. 1-FIG. 4 can also be applied to MEMS switches comprising double clamped beams or plates of e.g. disk or square shape suspended by means of support structures above a base structure 10.

The present invention is described with respect to particular embodiments and with reference to certain drawings but the invention is not limited thereto but only by the claims. Any reference signs in the claims shall not be construed as limiting the scope. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, first, second and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

The invention claimed is:

1. A MEMS device comprising a moveable structure, a base structure, at least one actuation structure moving the moveable structure, a self-locking device, an on-key, an off-key, and an electrical power supply electrically connected with the actuation structure and the self locking device via a first electrically conductive path passing the on-key, wherein the self locking device provides a second electrically conductive path between the electrical power supply and the actuation structure via the off-key.

2. The MEMS device according to claim 1, wherein the self locking device comprises a first self-locking electrode attached to the moveable structure, a second self-locking electrode attached to the base structure, and wherein the electrical power supply is electrically connected with the actuation structure and the first self locking electrode via the on-key, and the second self-locking electrode is electrically connected to the electrical power supply via the off-key.

3. The MEMS device according to claim 1, further comprising at least a first signal electrode attached to the moveable structure and at least a second signal electrode attached to the base structure.

4. The MEMS device according to claim 1, wherein the on-key is an n-channel field effect transistor (MOSFET of enhancement type) and the off-key is a n-channel field effect transistor (J-FET of depletion type).

5. The MEMS device according to claim 1, wherein the actuation structure moves the moveable structure by thermal deformation.

6. The MEMS device according to claim 1, wherein the actuation structure moves the moveable structure by electromagnetic actuation.

7. The MEMS device according to claim 1, wherein the actuation structure moves the moveable structure by piezoelectric actuation.

8. The MEMS device according to claim 1, wherein the actuation structure moves the moveable structure by electrostatic actuation.

9. A method of driving a MEMS device comprising a moveable structure, a base structure, at least one actuation structure moving the moveable structure, a self-locking device, an on-key, an off-key and an electrical power supply, comprising the steps of:
providing a first control signal of a first time period to the on-key;
providing electrical energy to the actuation structure via a first electrically conductive path passing the on-key during the first time period;
moving the moveable structure by the actuation structure during the first time period from a first state to a second state;
locking the moveable structure in the second state by the self-locking device providing a second conductive path between the electrical power supply and the actuation structure via the off-key during a second time period; and
releasing the moveable structure from the second state to the first state by applying a second control signal of a third time period to the off-key opening the self-locking device.

10. The method according to claim 9, further comprising:
providing a first feed-back signal to stop the first control signal after the moveable structure is locked; and
providing a second feed-back signal to stop the second control signal after the moveable structure is released.

* * * * *